(12) United States Patent
Urup

(10) Patent No.: US 9,214,913 B2
(45) Date of Patent: Dec. 15, 2015

(54) COMMUNICATION DEVICE WITH MOTION DEPENDENT AUTO VOLUME CONTROL

(71) Applicant: GN Netcom A/S, Ballerup (DK)

(72) Inventor: Morten Urup, Valby (DK)

(73) Assignee: GN Netcom A/S (DK)

( * ) Notice: Subject to any disclaimer, the term of this patent is extended or adjusted under 35 U.S.C. 154(b) by 35 days.

(21) Appl. No.: 14/080,308

(22) Filed: Nov. 14, 2013

(65) Prior Publication Data

US 2014/0140539 A1    May 22, 2014

(51) Int. Cl.
*H03G 3/00* (2006.01)
*H03G 3/20* (2006.01)
*H03G 3/32* (2006.01)

(52) U.S. Cl.
CPC ... *H03G 3/20* (2013.01); *H03G 3/32* (2013.01)

(58) Field of Classification Search
CPC ........ H04R 5/033; H04R 5/04; H04R 1/1041; H04R 1/1061; H04R 2420/07; H03G 3/24; H03G 3/32; H03G 9/005; H03G 9/025; H03G 3/00; H03G 3/20
USPC .............. 381/104–109, 71.6, 74, 57, 26, 309; 455/3.06, 569.1, 575.2; 379/430
See application file for complete search history.

(56) References Cited

U.S. PATENT DOCUMENTS

| | | | |
|---|---|---|---|
| 5,734,987 A * | 3/1998 | Shiono et al. | 455/570 |
| 6,125,288 A * | 9/2000 | Imai | 455/569.1 |
| 2010/0246847 A1* | 9/2010 | Johnson et al. | 381/74 |
| 2012/0002822 A1* | 1/2012 | Peissig et al. | 381/74 |
| 2013/0305840 A1* | 11/2013 | Saari et al. | 73/862.08 |

FOREIGN PATENT DOCUMENTS

CN    1925319    3/2007
CN    102595272  7/2012

OTHER PUBLICATIONS

1st Technical Examination of Danish patent application No. PA 2012 00724 dated Jun. 26, 2013.

* cited by examiner

*Primary Examiner* — Xu Mei
(74) *Attorney, Agent, or Firm* — Altera Law Group, LLC

(57) ABSTRACT

A communication device (1) comprising a speaker (2), a microphone (3), a noise detection module (7) adopted to determine an ambient noise level (NL) from a microphone signal received from the microphone (3) and an automatic volume control module (4), which in dependence of a change in noise level adjusts the speaker volume level (SL) to an adjusted level during an adaption time interval (TA). The communication device (1) comprises a motion sensor (5), and the length of the adaption time interval (TA) depends on a motion signal received from the motion sensor (5).

9 Claims, 3 Drawing Sheets

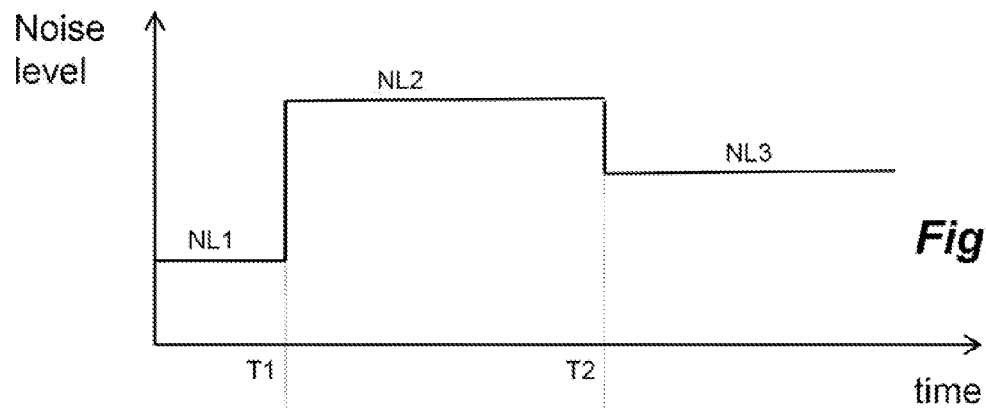
*Fig. 4A*
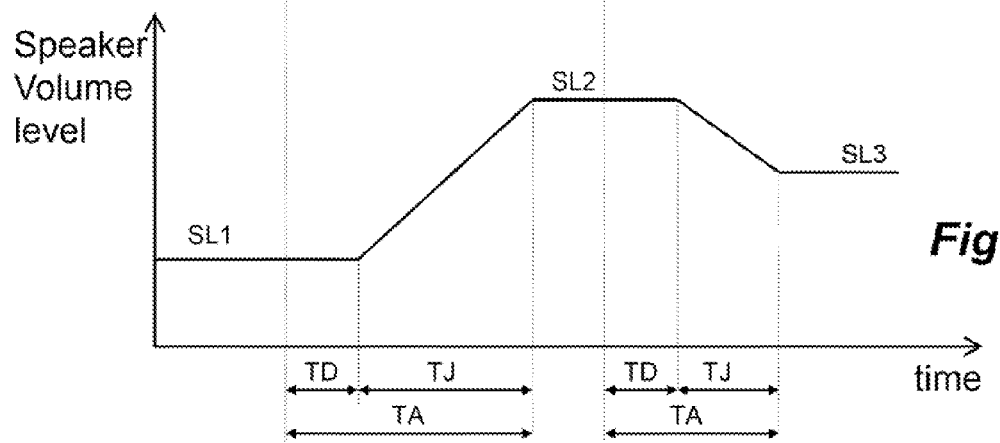
*Fig. 4B*
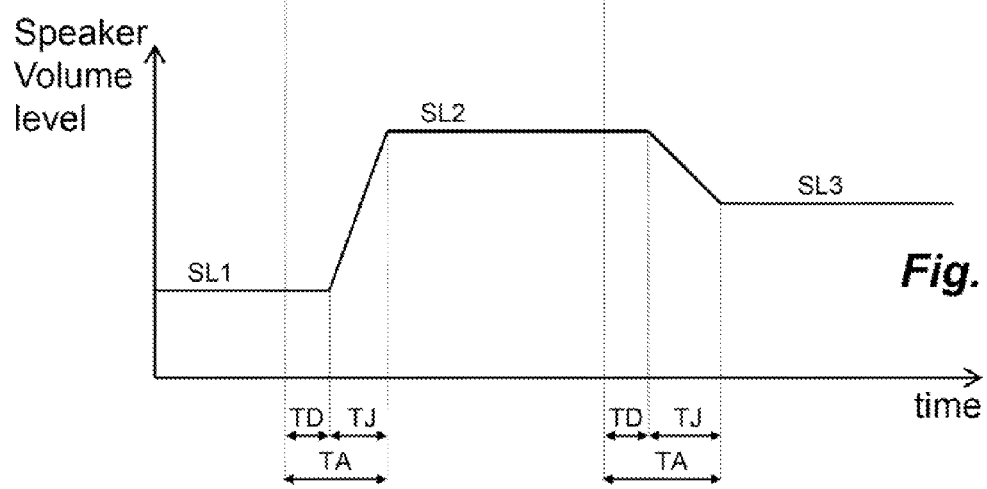
*Fig. 4C*
*Fig. 4*

COMMUNICATION DEVICE WITH MOTION DEPENDENT AUTO VOLUME CONTROL

TECHNICAL FIELD

The invention relates to a communication device comprising a speaker, a microphone, a noise detection module adapted to determine an ambient noise level from a microphone signal received from the microphone, an automatic volume control module, which in dependence of noise level change adjusts the speaker volume level to an adjusted level during an adaption time interval.

BACKGROUND ART

A communication device according to the preamble is known from U.S. Pat. No. 5,732,390 and could be a mobile phone or headset. The advantage of such a communication device is that the speaker volume is automatically adapted to the ambient noise whereby a user can still hear the audio emitted by the speaker although he enters more noisy environment. Also, when he enters a more quiet environment, the speaker volume is automatically lowered to a suitable level.

DISCLOSURE OF INVENTION

It is an object of the invention to provide an improved automatic volume regulation.

A communication device according to the invention comprises a speaker, a microphone, a noise detection module adapted to determine an ambient noise level from a microphone signal received from the microphone and an automatic volume control module, which in dependence of a change in noise level adjusts the speaker volume level to an adjusted level during an adaption time interval, wherein the communication device comprises a motion sensor, and wherein the length of the adaption time interval depends on a motion signal received from the motion sensor. When selecting the parameters of an automatic volume control module, it should be considered how fast a the adjustments should act. If a too fast volume adaption is selected, this could lead to fast and annoying volume increases and decreases due to a short high sound in the environment. According to the invention, a motion sensor is used to adjust the length of the time adaption interval, which can be utilised to adapt this to different user scenarios. Thus, the desired length of adaption time interval may differ between a situation where a user sits in a quite office and where he walks through a building with different noise levels at different locations.

According to an embodiment, the adaption time interval comprises a delay time interval followed by an adjustment time interval, wherein the delay time interval is a time interval that passes after a noise level change occurred, before the automatic volume control module starts the speaker volume adjustment. This has the advantage, that a real change in noise level can be detected before the speaker volume level is adjusted to a new level.

Preferably, the time delay interval depends on the signal received from the motion sensor.

According to an embodiment, the time delay interval is shorter, when motion is detected than when no motion is detected for a given noise level change.

According to an embodiment, the volume adjustment time interval depends on the signal received from the motion sensor.

According to an embodiment, the volume adjustment time interval is shorter, when motion is detected than when no motion is detected for a given noise level change.

According to an embodiment, only two values obtained from the motion signal are used for changing the adaption time interval, wherein one value corresponds to motion, and one value corresponds to no motion. This is a simple and reliable embodiment.

The motion sensor may be an accelerometer, preferably a three axes accelerometer.

The communication device may be a headset.

The headset may be corded or wireless and based on for example Bluetooth or DECT.

Alternatively, the communication device may be a wireless telephone, such as cell phone or smartphone.

BRIEF DESCRIPTION OF THE DRAWINGS

The invention is explained in detail below with reference to the drawing illustrating a preferred embodiment of the invention and in which.

MODES FOR CARRYING OUT THE INVENTION

Figure 1:
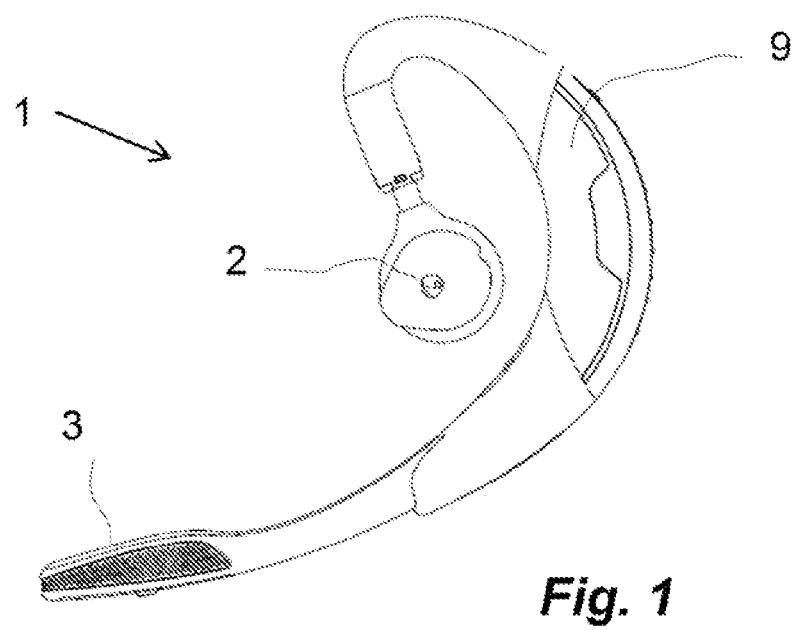
FIG. 1 is a side view of a preferred embodiment of a headset according to the invention.

FIG. 1 discloses a headset 1 according to the invention. The headset 1 is of the behind-the-ear type comprising an ear hook shaped housing 9, a speaker 2 and a microphone 3. A headset 1 of this type is sold under the name Jabra Wave.

Figure 2:
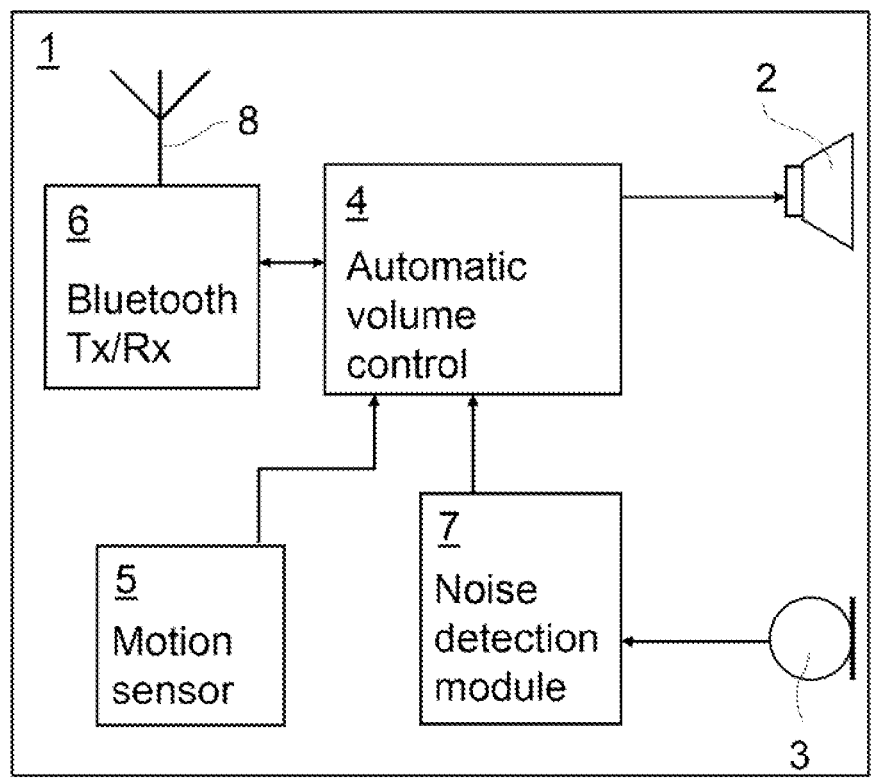
FIG. 2 is a diagram of the headset showing the essential parts relevant for the invention.

FIG. 2 discloses a diagram of the headset electronics with only parts relevant to explain the invention are shown. The headset 1 comprises the speaker 2, the microphone 3, an automatic volume control module 4, a motion sensor 5, a Bluetooth transceiver 6 and a Bluetooth antenna 8. By means of the Bluetooth transceiver 6, the headset 1 can be wirelessly connected to other Bluetooth enabled devices such as smart-phones and tablet computers and be used for hands free communication. The motion sensor 5 is a three axes linear accelerometer. The microphone 3 is used for receiving the users speech during use and is in this embodiment also used to determine background noise. However, other solutions where more than one microphone is used and/or a dedicated microphone adapted to detect background noise could also be contemplated. The background noise level is determined by the noise detection module 7 and a signal indicating this is forwarded to the automatic volume control module 4. The automatic volume control module 4 amplify the signal send to the speaker 2 in dependence on the noise level. The higher noise level, the higher speaker volume level.

Figure 3:
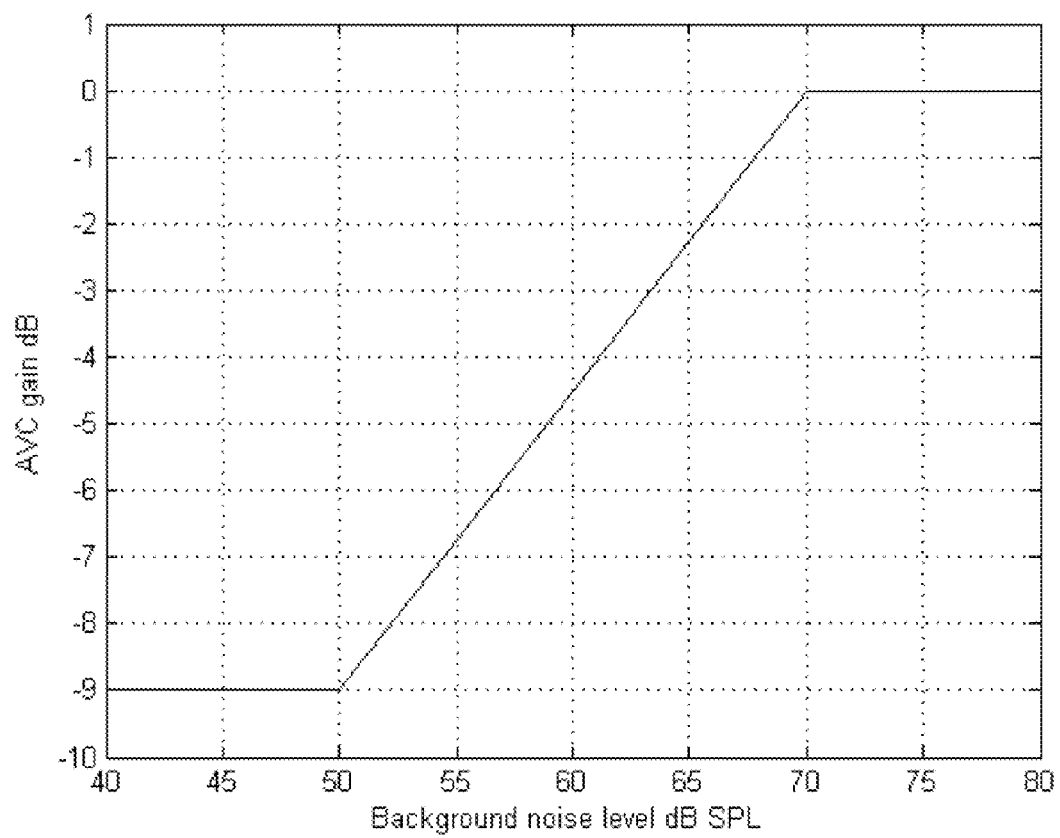
FIG. 3 is a graph showing a desired amplification of speaker signal in relation to background noise, and FIG. 4 (FIG. 4A, FIG. 4B, FIG. 4C) are diagrams showing how the speaker volume is adjusted as a result of noise changes according to an embodiment of the invention.

FIG. 3 discloses the correlation between background noise level and the automatic volume control gain. When the background noise level is below 50 dB SPL, the gain is −9 dB. When the background noise level is 60 dB SPL, the gain is approximately −4.5 dB. When the background noise is 70 dB SPL, the gain is 0 dB, which is the maximum gain.

A shown in FIG. 2, the accelerometer 5 is connected to the automatic volume control module 4. Hereby the speed at which the automatic volume control module 4 adapt the speaker volume level to the noise level depends on the signal received from the accelerometer. In fact, the adaption of the speaker volume level works faster, when the accelerometer output signal indicates motion. This will be explained in the following.

FIG. 4A shows a curve with different background noise levels during a time period. Until the time T1 the background noise is a first noise level NL1. At the time T1 the noise level rises to a second level NL2. At a time T2, the noise level decreases from the second noise level NL2 to a third noise level NL3, where it stays.

FIG. 4B shows how the speaker volume level is adapted to the background noise level when the headset user is not in motion and for example sitting on a chair. At the time T1, the noise detection module 7 determines that the noise level is increased to the second noise level NL2. The automatic volume control module 4 adapts the speaker volume level from the a first speaker volume level SL1, which is suitable for the first noise level NL1, to a second speaker volume level SL2, which is suitable for the second noise level NL2. However, this adaption does not happen immediately. First, there is delay time interval TD, where the speaker volume level is not changed and hereafter the speaker volume level increases from SL1 to SL2 during an adjustment time interval TJ. The total adaption time interval TA is the sum of the delay time interval TD and the adjustment time interval TJ:

$$TA = TD + TJ$$

A reason for the delay time interval is, that the noise detection module currently detects the lowest audio level in a time interval. If this time interval is too short, there is a risk, that speech is detected as the lowest audio level and thereby interpreted as noise, which would cause an undesired increase in speaker volume level. Thus, the delay time interval TD is a trade-off between the wish to have a certain noise determination and a fast response.

In FIG. 4B, there is no motion detected, and in this situation the delay time interval is typically about 4 seconds. The adjustment time can be for example 2-6 seconds depending on size of the noise level change and the design of the control module.

At the time T2, the noise detection module 7 determines that the noise level is decreased to the third noise level NL3. Thus, at T2, a new delay time interval TD starts, followed by an adjustment time interval TJ, which is shorter than the adjustment time interval when the noise changed from the first noise level NL1 to the second noise level NL2, because the noise level change from the second noise level NL2 to the third noise level NL3 is smaller.

FIG. 4C shows how the speaker volume level is adapted to the background noise when the headset user is in motion and for example walking down a corridor. In this case, the delay time interval TD is reduced to about 2 seconds, and also the adjustment time interval TJ is reduced.

An advantage with the embodiment above is, that a user in motion may prefer a faster speaker volume adjustment, as he may move relatively fast between environments with different noise levels. If he, for example, during a conversation enters a canteen with a high noise level, it may be a disadvantage if he must wait 5-6 seconds before he can hear clearly. If a user, on the other hand sits in a quite office, he may prefer, that the speaker volume is not adjusted just because a short noise occur, for example if a colleague in the room opens and closes the door within few seconds.

The motion sensor and or the automatic volume control module should off course be calibrated", such that a certain amount of motion is needed, before it affect the speaker volume adjustment.

In the shown embodiment, the speaker volume adjustment is adapted to "motion" or "no motion". The controls system could also be more gradually or linear driven, such that the delay time and/or adjustment time is inversely proportional with motion level.

It could also be contemplated that the delay time interval TD is zero, whereby the adaption time TA=adjustment time TJ.

The headset could be provided with the possibility to disable the motion sensor functionality.

The invention is not limited to the embodiments disclosed here.

REFERENCE SIGNS 1 headset
2 speaker
3 microphone
4 automatic volume control module
5 motion sensor
6 wireless transceiver
7 noise detection module
8 Bluetooth antenna
9 Headset housing
NL noise level
SL speaker volume level
T1 time at which noise level changes
T2 time at which noise level changes
TA adaption time interval
TD delay time interval
TJ adjustment time interval

The invention claimed is:

1. A communication device comprising a speaker, a microphone, a noise detection module adapted to determine an ambient noise level (NL) from a microphone signal received from the microphone and an automatic volume control module, which in dependence of a change in noise level adjusts the speaker volume level (SL) to an adjusted level during an adaption time interval (TA), wherein the communication device comprises a motion sensor, and wherein the length of the adaption time interval (TA) depends on a motion signal received from the motion sensor, wherein the adaption time interval (TA) comprises a delay time interval (TD) followed by an adjustment time interval (TJ), wherein the delay time interval (TD) is a time interval that passes after a noise level change (NLC) occurred, before the automatic volume control module starts the speaker volume adjustment.

2. A communication device according to claim 1, wherein the time delay interval (TD) depends on the signal received from the motion sensor.

3. A communication device according to claim 2, wherein the time delay interval (TD) is shorter, when motion is detected than when no motion is detected for a given noise level change.

4. A communication device according to claim 1, wherein the volume adjustment time interval (TJ) depends on the signal received from the motion sensor.

5. A communication device according to claim 4, wherein the volume adjustment time interval (TJ) is shorter, when motion is detected than when no motion is detected for a given noise level change.

6. A communication device according to claim 1, wherein only two values obtained from the motion signal are used for changing the adaption time interval (TA), wherein one value corresponds to motion, and one value corresponds to no motion.

7. A communication device according to claim 1, wherein the motion sensor is an accelerometer.

8. A communication device according to claim 1, being a headset.

9. A communication device according to claim 1, which communication device is a wireless headset.

* * * * *